United States Patent
Clark et al.

(10) Patent No.: US 6,605,943 B1
(45) Date of Patent: Aug. 12, 2003

(54) METHOD OF MAPPING PROTON TRANSVERSE RELAXATION TIME CONSTANTS OR FUNCTIONS THEREOF IN A TARGET SUBJECT TO LOCALISED MOVEMENT USING NUCLEAR MAGNETIC RESONANCE IMAGING

(75) Inventors: Paul Clark, Edgewater (AU); Timothy St. Pierre, Beaconsfield (AU)

(73) Assignee: Inner Vision Biometrics Pty Ltd (AU)

(*) Notice: Subject to any disclaimer, the term of this patent is extended or adjusted under 35 U.S.C. 154(b) by 0 days.

(21) Appl. No.: 10/069,272
(22) PCT Filed: Aug. 24, 2000
(86) PCT No.: PCT/AU00/00999
  § 371 (c)(1),
  (2), (4) Date: Feb. 25, 2002
(87) PCT Pub. No.: WO01/14899
  PCT Pub. Date: Mar. 1, 2001

(30) Foreign Application Priority Data

Aug. 24, 1999 (AU) .................... PQ 2415
Aug. 25, 1999 (AU) .................... PQ 2443

(51) Int. Cl.$^7$ ........................... G01V 3/18
(52) U.S. Cl. ............................. 324/309
(58) Field of Search ................ 324/309, 307, 324/306, 314; 128/653.2; 600/410

(56) References Cited

U.S. PATENT DOCUMENTS

| | | | | |
|---|---|---|---|---|
| 4,937,526 A | * | 6/1990 | Ehman | 324/309 |
| 5,092,335 A | | 3/1992 | Le Bihan | 128/653.2 |
| 6,144,201 A | * | 11/2000 | Miyazaki | 324/309 |

* cited by examiner

Primary Examiner—Edward Lefkowitz
Assistant Examiner—Brij B. Shrivastav
(74) Attorney, Agent, or Firm—Edell, Shapiro & Finnan, LLC (57) ABSTRACT

A method of generating a map or distribution of parameters that are a function of proton transverse relaxation time ($T_2$) constant in a target subject to localised movement (such as in abdominal tissue) by using nuclear magnetic resonance imaging. The method compensates for localised movement, (e.g. breathing artefacts) in the imaging by spatial neighboring averaging of image intensities over a region of interest subject to the localised movement. A map or distribution of $T_2$ parameters is then calculated over the entire region of interest. To ensure accuracy and position of the $T_2$ values, the effects of signal level off set, instrumental drift, and noise level is incorporated into the calculations.

28 Claims, 8 Drawing Sheets

METHOD OF MAPPING PROTON TRANSVERSE RELAXATION TIME CONSTANTS OR FUNCTIONS THEREOF IN A TARGET SUBJECT TO LOCALISED MOVEMENT USING NUCLEAR MAGNETIC RESONANCE IMAGING

FIELD OF THE INVENTION

The present invention relates to a method of mapping proton transverse relaxation time constants, or functions thereof, in a target subject to localized movement, such as abdominal tissue, using nuclear magnetic resonance imaging.

BACKGROUND OF THE INVENTION

Magnetic resonance imaging is an imaging modality that has been developed to elucidate the internal structure of essentially diamagnetic bodies through exploitation of the phenomenon of nuclear magnetic resonance. From a semi-classical standpoint, in a static magnetic field, nuclear isotopes that have a nuclear magnetic moment experience a torque which causes the moments to precess around the axis of the field at a frequency that is proportional to the magnitude of the magnetic moment and the magnitude of the applied field. Further, the orientations of the nuclear magnetic moments are quantised in a limited number of spin states. Thus, for a particular nuclear species, the moments or spins precess at the same frequency in random phase around the direction of the field but in different equilibrium populations of spin states. If a radio frequency (RF) pulse is applied with a frequency that matches the precessional frequency of a certain nuclear species, the populations of the spin states will be perturbed from their equilibrium values. Further, the spins acquire a certain level of phase coherence in that they precess in some measure of synchrony with each other. After the RF pulse is removed, the spins return to their equilibrium populations by two relaxation processes for which a magnetic resonance signal having the same frequency as the RF pulse can be detected. One of the relaxation processes involves the return of the spins to their equilibrium population values, called spin-lattice or longitudinal relaxation, for which the relaxation rate is characterised by the longitudinal relaxation time constant $T_1$. The other relaxation process is one in which the spins lose their phase coherence, called spin-spin or transverse relaxation, for which the relaxation rate is characterised by the transverse relaxation time constant $T_2$. For a particular nuclear species, the relaxation rates can vary greatly according to the chemical environment surrounding each isotope, on both the molecular and macro-molecular scale. The outstanding image contrast that can be achieved by MRI is a function of the variation in these relaxation rates, coupled with the variations in nuclear density that occur throughout the body being imaged.

Although there are a number of nuclear species for which magnetic resonance can be observed, the hydrogen proton is of the greatest relative sensitivity. Consequently, it is the nuclear species around which magnetic resonance imaging has been developed. The hydrogen proton is also the most abundant nuclear species within the human body, with approximately two thirds of the body hydrogen contained in water molecules and the remainder found in fat and protein. The hydrogen proton thus makes an ideal probe for anatomical imaging. The remarkable level of soft tissue contrast that can be obtained by MRI is a result of the variation in hydrogen proton density and relaxation times for different tissues, and the perturbation of these times in various disease states.

Magnetic resonance images are constructed by varying the magnetic field strength in three dimensions throughout the subject or target to be examined. The variations in magnetic field result in precessional frequency changes of the nuclear species at various points in space, and thus enable the discrimination of magnetic resonance signals from different spatial locations. A map of signal intensities can then be constructed to obtain a magnetic resonance image. Depending on the manner in which the RF pulse is applied to cause magnetic resonance, the images that result can either be predominantly $T_1$-weighted or $T_2$-weighted. In $T_1$-weighted images, the image intensities predominantly reflect the progression of spin-lattice relaxation, the extent of which depends on when the magnetic resonance signals are acquired. In $T_2$-weighted images, the intensities essentially reflect the progression of spin-spin relaxation.

Typically, the relaxation time constant for a given region of interest over the image sequence is determined through the fitting of an equation to the measured signal intensities that describes the return of the hydrogen protons to their equilibrium spin states. For relaxation processes modeled in this fashion, the relaxation time constant that is determined is essentially an average of each and every relaxation time constant for each and every hydrogen proton within the region of interest. However, within any given region of interest, there may be particular populations of hydrogen protons that do not necessarily neighbour in space but which neighbour in terms of the chemical and physical environments which the protons experience, and which are thus characterised by their own distinct relaxation times. For example, the population of hydrogen protons found in fat will have distinctly different relaxation times from the population of hydrogen protons found in extra-cellular water. Thus, depending on the number of images acquired at different measurement times, a number of relaxation processes may be determined within the one region of interest for different populations of hydrogen protons. For the number of relaxation processes that are desired to be resolved, the equation that describes the return of the hydrogen protons to their equilibrium spin states is separately summed for each distinct population. For transverse relaxation, where the average relaxation process is characterised by a single exponential decay term involving the relaxation time constant and the measurement time, the relaxation time constant calculated is typically referred to as that for single (or mono-) exponential decay. When two or more transverse relaxation processes are being modeled, a number of exponential decay terms are summed, and the resulting equation is referred to as one of multi-exponential decay. When only two transverse relaxation processes are being modeled, the equation is one for double (or bi-) exponential decay. In this instance, it is common to refer to fast and slow relaxation components of hydrogen protons, ie: a population of hydrogen protons that undergo fast relaxation back to their equilibrium spin rates, and a population of hydrogen protons that experience slow relaxation.

For a sequence of either $T_1$- or $T_2$-weighted images acquired at different measurement times, the relaxation time constants of the dominant relaxation process can be theoretically determined over the entire image. However, the calculation of a map of $T_1$ or $T_2$ relaxation times constants is complicated when the region to be examined is affected by some form of localized movement. This arises, for example, in imaging of the abdomen, where the regular, repetitive motion of breathing results in image intensity perturbations across the image. The existence of breathing artefacts over the region of interest makes the calculation of both accurate and complete $T_1$ or $T_2$ maps infeasible. To date, the successful generation of relaxation time maps has only been reported in those cases where sample movement is not a factor, as in non-medical applications of materials research and NMR microscopy, and in imaging of the brain, where pulsatile and respiratory affects may be considered to be negligible. The successful generation of accurate and complete relaxation time maps over the abdomen or other targets subject to a similar extent of localized movement has not been demonstrated.

The image intensity perturbations caused by localized movement arise as a result of the method of image construction. To obtain magnetic resonance images of sufficient intensity for both qualitative and quantitative analysis, the image signal intensities must be sufficiently above the background image noise. To obtain such intensities, repeated measurements must be performed over the same measurement (or repetition) time and the signal intensities cumulated. As noise is not additive, the signal-to-noise ratio increases, and useful image intensities can be obtained. However, this process is adversely affected when the area to be examined is subject to localized movement, as in imaging of the abdomen. The action of breathing causes the image signal intensity measured for a particular volume in space to be some average of the relaxation processes and proton densities for those parts of the body moving through that volume. Consequently, the image intensity no longer identifies a fixed volume within the subject. More importantly though, for a sequence of images acquired at different measurement times, the calculation of a map of accurate and complete relaxation time constants for some region of interest over the images becomes infeasible.

Compensating for movement within the magnetic resonance images does not in itself ensure the calculation of accurate relaxation time constants. To obtain truly valid relaxation time constants, a number of other factors must be accounted for.

SUMMARY OF THE INVENTION

It is an objective of the present invention to provide a method of generating a map or distribution of values of parameters that are a function of the proton transverse relaxation time constants in a target subject to localized movement, using nuclear magnetic resonance imaging.

According to the present invention there is provided a method of generating a map or distribution of values of parameters that are a function of proton transverse relaxation time constants $T_2$ in a target subject to localized movement using nuclear magnetic resonance imaging, the method comprising at least the steps of:

acquiring a sequence of three or more $T_2$-weighted magnetic resonance images of an identical image plane through the target at different spin-echo times;

defining a region of interest (ROI) over the target within the $T_2$-weighted images that identifies the same region across all of the images;

processing image intensities of each $T_2$ weighted image within the region of interest (ROI) by application of an image filter that compensates for image intensity perturbations caused by localized movement of the target in said ROI to produce a filtered image intensity for each $T_2$-weighted image;

calculating parameters that are a function of $T_2$ by a curve-fitting procedure applied to the filtered image intensities as a function of the spin-echo time (TE); and, generating a map or distribution of, values of said parameters calculated by said curve fitting procedure or of, other parameters that are a function of or correlate with the parameters calculated by said curve fitting procedure.

Preferably said step of acquiring the sequence of $T_2$-weighted images is performed at spin-echo times that are at least one order of magnitude less than the time between repetitions of consecutive RF pulse sequences used in the generation of said $T_2$-weighted images. This time is known as the "repetition time".

Preferably said application of an image filter involves employing a procedure of spatial neighbourhood averaging to replace an image intensity within any $T_2$-weighted image at a given location within said ROI by an intensity that is a function of neighboring intensities in that image.

Preferably said neighboring intensities employed in the spatial neighbourhood averaging are bounded by a rectangular window kernel that covers a first range of movement of the target along a first axis of the image plane and a second range of movement of the target along a second perpendicular axis of the image plane.

Preferably, when said target is abdominal tissue, the first range of movement is between about 5 mm to 17 mm along said first axis perpendicular to a coronal plane and the second range of movement is about 4 mm to 14 mm along said second axis lies either in a sagittal plane or an axial plane whereby, in use, the method accommodates for the breathing artefacts in the $T_2$-weighted images.

Preferably said curve fitting procedure includes incorporation of factors to compensate for one or more of background signal level offset; instrumental drift; and measurement errors on the image intensities. Preferably said curve fitting procedure also includes consideration of the vicinity of the image intensities to background noise level.

Preferably said curve fitting procedure includes fitting the following equation to the processed image intensities as a curve which models the decay of said intensities with increasing TE $$I(TE) = \sum_{n=1}^{N} (I_n(0)e^{-TE/T_{2n}}) + S_{LO}$$

where:

I(TE) is a processed image intensity at a given TE;

$S_{LO}$ is the signal level offset of the image signal intensities; and, when N=1, the said equation models single exponential decay, and where substituting I(0) for $I_1(0)$ and $T_2$ for $T_{21}$:

I(0) is the unknown intensity at TE=0 ms and is to be determined by the curve fitting procedure;

$T_2$ is the unknown transverse relaxation time constant that characterises the decay of the processed image intensities with increasing TE and is to be determined by the curve fitting procedure;

or, when N=2, the said equation models bi-exponential decay, and where substituting $I_f(0)$ for $I_1(0)$, $T_{2f}$ for $T_{21}$, $I_s(0)$ for $I_2(0)$, and $T_{2s}$ for $T_{22}$:

$I_f(0)$ is the unknown intensity at TE=0 ms due to a fast relaxation component of hydrogen protons and is to be determined by the curve fitting procedure;

$T_{2f}$ is the unknown transverse relaxation time constant that characterises the decay of the processed image intensities with increasing TE for the fast relaxation component of hydrogen protons and is to be determined by the curve fitting procedure;

$I_s(0)$ is the unknown intensity at TE=0 ms due to a slow relaxation component of hydrogen protons and is to be determined by the curve fitting procedure;

$T_{2s}$ is the unknown transverse relaxation time constant that characterises the decay of the processed image intensities with increasing TE for the slow relaxation component of hydrogen protons and is to be determined by the curve fitting procedure.

Preferably said signal level offset is determined by analysis of background image intensities in a region free of image intensity perturbations caused by localized movement.

Preferably said background is a region within the $T_2$-weighted images that is predominantly free of the presence of hydrogen protons.

Preferably said signal level offset is taken as the mean intensity of a Poisson distribution fitted to the distribution of background image intensities.

Preferably background noise level is derived as the mean of said Poisson distribution plus one standard deviation.

Preferably said Poisson distribution fitted to the background image intensities is the generalised Poisson distribution of the form $$P(\chi) = \frac{\alpha\theta(\theta + \chi\lambda)^{(\chi-1)}e^{-(\theta+\chi\lambda)}}{\sqrt{2\pi\chi}\,(\chi/e)^{\chi}}, \quad \chi \geq 1$$

where:

$\chi$ is an image intensity value;

$\alpha$ is a scale factor, and;

$\theta$ and $\lambda$ parameterise the Poisson distribution, and for which the mean $\mu$ of the Poisson distribution is $\mu=\theta(1-\lambda)^{-1}$ and the variance $\sigma^2$ is $\sigma^2=\theta(1-\lambda)^{-3}$ Preferably the method further includes imaging of a phantom in-situ with the subject in the $T_2$-weighted magnetic resonance images for image intensity correction or image intensity error calculation purposes.

Preferably the $T_2$-weighted images are acquired with fixed gain settings.

Preferably said $T_2$-weighted images are acquired over spin-echo times for which image intensities of the phantom are substantially constant, or for which a percentage change in the image intensities of the phantom over the spin-echo times is accurately known.

Preferably said phantom image intensities over the sequence of $T_2$-weighted images are analysed to determine ROI scale factors for each image relative to one of the images to correct for the possible instrumental drift that perturb the image signal intensities in the ROI over the sequence of $T_2$-weighted images.

Preferably said ROI scale factors that correct for the instrumental drift are determined by:

choosing one of the $T_2$-weighted images as a reference image and treating any remaining $T_2$-weighted images as scalable images;

obtaining mean intensity values for a number of regions over the phantom which are substantially free of intensity gradients in three or more of the $T_2$-weighted images and for which the regions are the same in each image;

assigning the mean intensity values for the reference image to reference intensity values;

dividing the mean intensity value for every region over the phantom for each scalable image by the reference intensity value for a matching region in the reference image to obtain an instrumental drift scale factor for every region in each of the scalable images;

calculating the mean instrumental drift scale factor from the instrumental drift scale factors from any number of regions over the phantom for each scalable image;

using the standard deviation of the instrumental drift scale factors as an uncertainty factor on the mean instrumental drift scale factor, and;

assigning the mean instrumental drift scale factor for a scalable image to the ROI scale factor for that image.

Preferably the method also includes the step of incorporating any percentage change of said phantom image intensities over the spin-echo times into the ROI scale factor for each image for those $T_2$-weighted image sequences for which the phantom image intensities are not effectively constant.

Preferably said instrumental drift over said sequence of $T_2$-weighted images is corrected for by dividing the filtered image intensities of each image by an associated ROI scale factor for that image.

Preferably the regions over the phantom for which instrumental drift scale factors are calculated exhibit a substantially identical measure of RF field variation as that over the ROI.

Preferably said intensity measurement error on the filtered image intensities specified for the curve-fitting procedure is calculated as the standard error over the ROI of differenced intensity values which are the filtered image intensities subtracted from unprocessed image intensities.

Preferably said standard error used as the intensity measurement error on the filtered image intensities is calculated as the standard deviation over the ROI of said differenced intensity values divided by the square root of the number of intensity values in the neighbourhood of intensities over which the image filtering was performed.

Preferably said parameters calculated by said curve-fitting procedure for the ROI facilitate identification and characterisation of normal and abnormal tissue types.

Preferably said ROI is through the liver of an animal or person and said parameters calculated by the curve-fitting procedure are used to determine the presence and extent of one or more of: fibrosis, cirrhosis, lesions or tumours.

Preferably said parameters calculated by the curve-fitting procedure are formulated so that they further correlate with a measure of tissue iron overload for that region.

Preferably said formulation for when N=1 for the curve-fitting equation is:

$$\frac{1}{T_2}$$

Preferably said formulation for when N=2 for the curve-fitting equation is:

$$\frac{I_f(0) - S_{LO}}{(I_f(0) + I_s(0) - 2S_{LO})T_{2f}}$$

Preferably said measure of tissue iron overload is a measure of hepatic iron concentration.

Preferably said parameters calculated by said curve-fitting procedure are transverse relaxation rates and for which the distribution of transverse relaxation rates is parameterised by as few as one or two Gaussian functions to further characterise the ROI.

BRIEF DESCRIPTION OF THE DRAWINGS

An embodiment of the present invention will now be described by way of example only with reference to the accompanying drawings in which.

DETAILED DESCRIPTION OF THE PREFERRED EMBODIMENT

Figure 1:
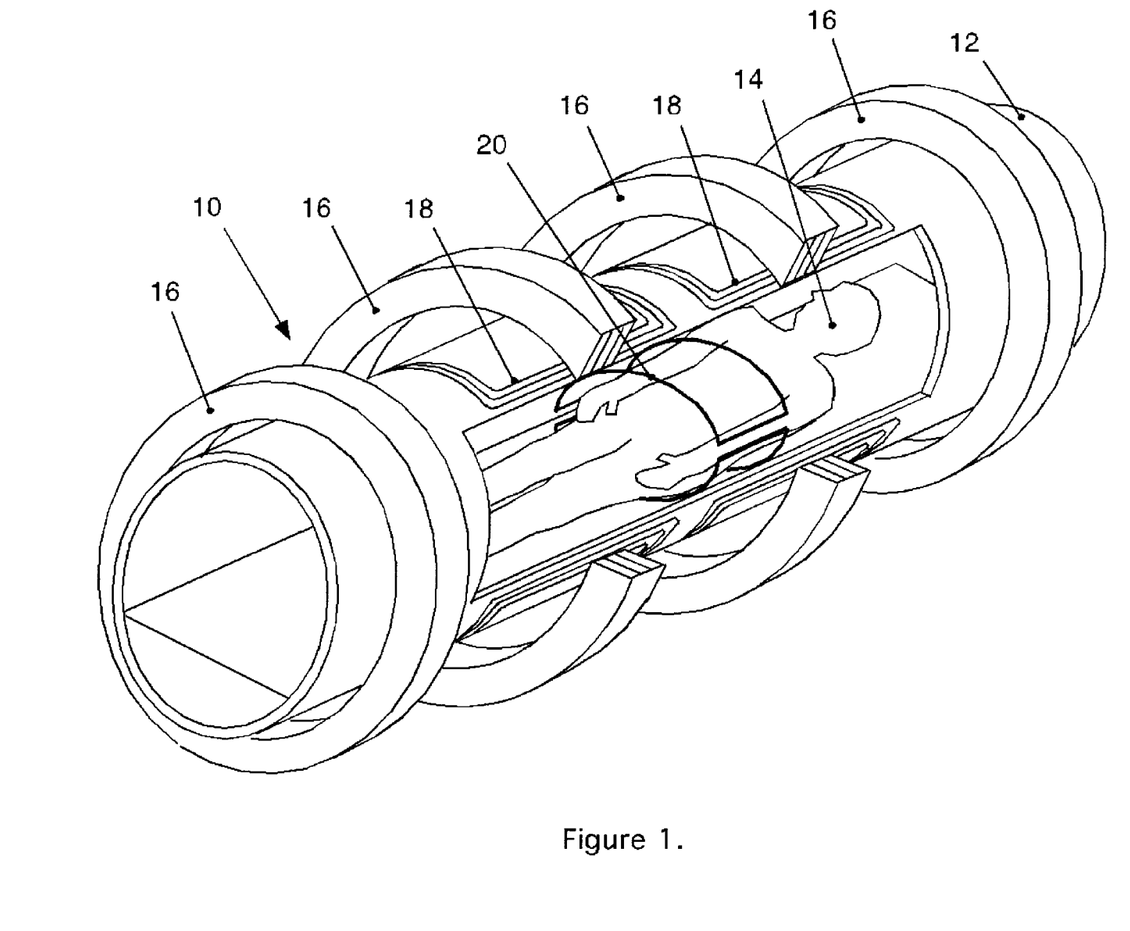
FIG. 1 is a schematic representation of a magnetic resonance imager.

FIG. 1 illustrates a magnetic resonance imager 10 that can be used to perform an embodiment of the present method. The physical structure of the imager 10 is part of the prior art and does not form part of the invention itself. The imager 10 includes a horizontally extending chamber 12 in which a patient 14 lies in a supine position during the imaging process. Surrounding the chamber 12 is a plurality of spaced main ring magnets 16. Supported on the outside of the chamber 12 is a plurality of gradient coils 18 for producing and varying the gradient on the magnetic field generated by the main ring magnets 16 and which acts through the patient 14. Finally, within the chamber 12 is an RF coil 20. RF pulses are applied through the RF coil 20 to excite protons within the patient 14 away from their equilibrium spin states.

Figure 2:
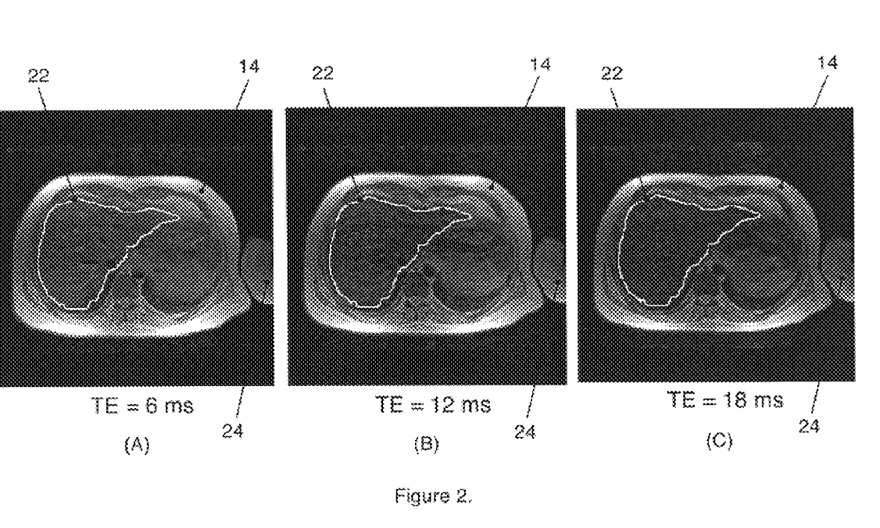
FIGS. 2A–2C are magnetic resonance images of the abdomen taken at three different spin-echo times.

In the present method, three of more $T_2$-weighted magnetic resonance images of the same image plane are acquired through a target, in this case the abdomen of patient 14, at different spin-echo times (TE). This is depicted in FIGS. 2A–2C and FIG. 3. FIGS. 2A, 2B and 2C illustrate the magnetic resonance image through the abdomen of patient 14 at spin-echo times TE=6 ms, TE=12 ms and TE=18 ms respectively. As shown in FIGS. 2A–2C, a region of interest (ROI) 22, outlining the liver tissue of patient 14, is defined within the $T_2$-weighted images. This ROI 22 is common for all of the images acquired at the different spin-echo times. The spin-echo times TE are required to be all significantly less than the repetition time by at least an order of magnitude. The repetition time is the measurement time between applying consecutive RF pulse sequences to measure either $T_1$ or $T_2$-weighted images. More specifically, the repetition time is the time one waits during both acquisition and following the decay of a magnetic resonant signal before re-exciting the signal. Typically 50 or more repetitions have to be performed to obtain images with a satisfactory signal-to-noise ratio.

The image intensities within the region of interest 22 of each image are processed by application of an image filter that compensates for the image intensity perturbations caused by respiration of the patient 14. The preferred image filter is one that employs spatial neighbourhood averaging to compensate for the image intensity perturbations caused by respiration. This type of image filter replaces an image intensity with any of the $T_2$-weighted images at a given location within the ROI 22 by an intensity that is a function of the neighboring intensities in that image. In the present embodiment of the filter, the neighbourhood of intensities is bounded by a rectangular window kernel that covers a range of respiratory movement over about 5 mm to 17 mm perpendicular to the coronal plane and about 4 mm to 14 mm perpendicular to the sagittal plane to specifically accommodate the breathing artefacts in the $T_2$-weighted images.

Curve fitting to the filtered image intensities as a function of the spin-echo times TE is accomplished through an equation of the preferred form $$I(TE) = \sum_{n=1}^{N} (I_n(0)e^{-TE/T_{2n}}) + S_{LO} \quad (1)$$

which for single exponential decay of the intensities, ie when N=1, reduces to $$I(TE)=I(0)e^{-TE/T_2}+S_{LO}$$

where $I(0)$ is $I_1(0)$ and $T_2$ is $T_{21}$. With this definition, $I(TE)$ is a processed image intensity at a given TE, $I(0)$ is the unknown intensity at TE=0 ms (and is to be determined by the curve-fitting procedure), $T_2$ is the unknown transverse relaxation time constant that characterises the decay of the processed image intensities with increasing TE (and is to be determined by the curve-fitting procedure), and $S_{LO}$ is the signal level offset of the image signal intensities. The curve fitting involves incorporation of background signal level offset, instrumental drift, and the extent of the measurement errors on the filtered image intensities to obtain accurate and precise transverse relaxation time constants. The curve fitting also requires due consideration of the vicinity of the filtered image intensities to the background noise level.

Figure 3:
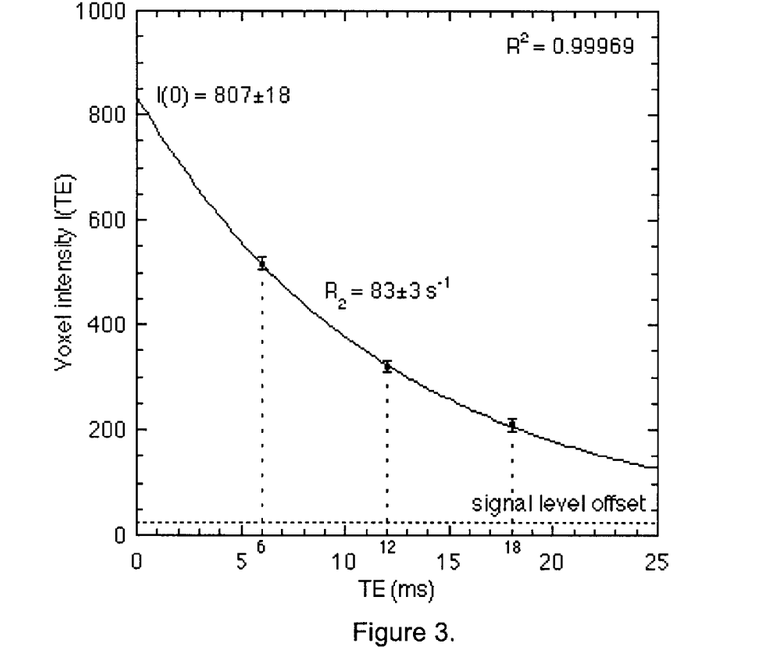
FIG. 3 illustrates the curve-fitting to a filtered image intensity value at different spin-echo times for a particular location (voxel) within the ROI.

This curve fitting is depicted in FIG. 3 which illustrates the filtered image intensity value for a particular location (voxel) within the ROI at three spin-echo times, TE=6 ms, 12 ms and 18 ms. In this embodiment of the curve-fitting, the inverse of the transverse relaxation time constant $T_2$ has been determined, which is known as the transverse relaxation rates $R_2$. The signal level offset $S_{LO}$ is determined by analysis of the background image intensities in a region free of image intensity perturbations caused by respiratory movement. The background is taken to mean a region within the $T_2$-weighted images that is predominantly free of the presence of hydrogen protons, as is the case for air. The preferred value for the signal level offset is that which is the mean intensity of a Poisson distribution fitted to the distribution of background intensities. In this instance, the background noise level is taken as the mean of the Poisson distribution plus one standard deviation. The Poisson distribution fitted to the background image intensities is the generalised Poisson distribution of the form $$P(\chi) = \frac{\alpha\theta(\theta+\chi\lambda)^{(\chi-1)}e^{-(\theta+\chi\lambda)}}{\sqrt{2\pi\chi}\,(\chi/e)^\chi}, \quad \chi \geq 1$$

where $\chi$ is an image intensity value, $\alpha$ is a scale factor, and $\theta$ and $\lambda$ parameterise the Poisson distribution. The mean $\mu$ of the Poisson distribution is $$\mu = \theta(1-\lambda)^{-1}$$

and the variance $\sigma^2$ is $$\sigma^2 = \theta(1-\lambda)^{-3}$$

Figure 4:
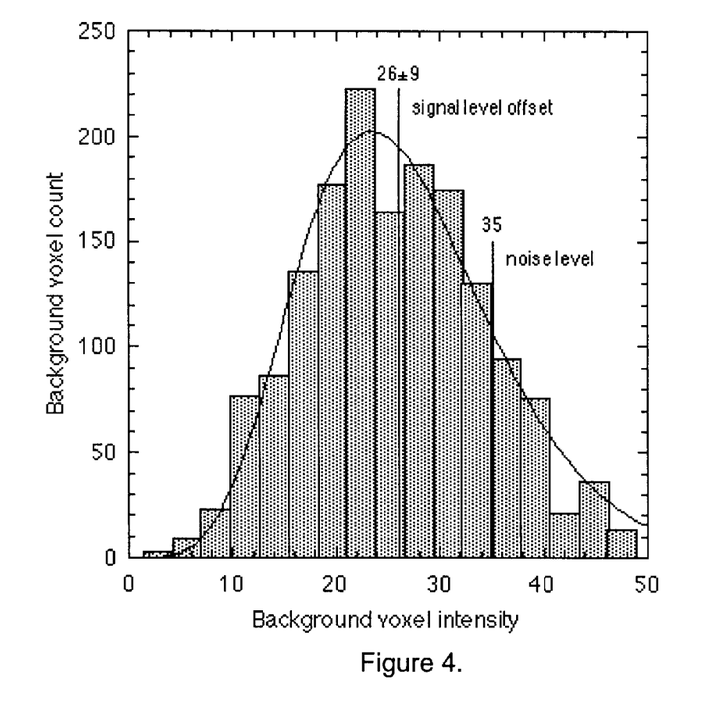
FIG. 4 illustrates a distribution of background image intensities and indicates the signal level offset used in the curve-fitting of FIG. 3.

The fitting of the background image intensities to a generalised Poisson distribution is illustrated in FIG. 4. This is a special case where the Poisson distribution is almost a Gaussian distribution. As a matter of interest, the signal level offset used in the curve-fitting depicted on FIG. 3 is indicated on FIG. 4 and is the mean of the illustrated Poisson distribution.

In acquisition of the $T_2$-weighted magnetic resonance images a phantom is preferably imaged in situ with the subject for image intensity correction or image intensity error calculation purposes. In this embodiment the phantom is a 1000 ml bag 24 of water (refer FIGS. 2A–2C) adjacent to the patient 14 and disposed adjacent to the region 22 under consideration.

The $T_2$-weighted images are preferably acquired with fixed gain settings. Further, the $T_2$-weighted images are acquired over spin-echo times for which the phantom image intensities are substantially constant, or for which the percentage change in the phantom image intensities over the spin-echo times is accurately known. The phantom image intensities are then analysed to determine ROI scale factors for each image relative to a selected image to correct for possible instrumental drift that can perturb the image signal intensities in the ROI over the sequence of $T_2$-weighted images. The instrumental drift over the image sequence is corrected for by dividing the filtered image intensities of each image by the associated ROI scale factor for the image. Any percentage change of the phantom image intensities over the spin-echo times is incorporated into the ROI scale factor for each image for those $T_2$-weighted image sequences for which the phantom image intensities are not effectively constant.

The preferred method for determining the ROI scale factors that correct for instrumental drift over the image sequence is as follows. One of the $T_2$-weighted images is chosen as a reference image and the other $T_2$-weighted images are treated as scalable images. Next, mean intensity values are obtained for a number of regions over the phantom which are essentially free of intensity gradients in three or more of the $T_2$-weighted images, and for which the regions are the same in each image. The mean intensity values for the reference image are then assigned as reference intensity values. The mean intensity value for every region over the phantom for each scalable image is then divided by the reference intensity value for the matching region in the reference image to obtain an instrumental drift scale factor for every region in each of the scalable images. A mean instrumental drift scale factor is then calculated from the instrumental drift scale factors for every region over the phantom for each scalable image. The standard deviation of the instrumental drift scale factors for a particular scalable image is used as the uncertainty on the mean instrumental drift scale factor for that image. The mean instrumental drift scale factor for a scalable image is then ascribed to the ROI scale factor for that image. The regions over the phantom for which instrumental drift scale factors are calculated exhibit the same measure of RF field variation as that over the ROI.

The intensity measurement error on the filtered image intensities specified for the curve-fitting procedure (refer to the error bars on the intensity data in FIG. 3) is calculated as the standard error over the ROI of differenced intensity values which are the filtered image intensities subtracted from the unprocessed image intensities. The standard error used as the intensity measurement error on the filtered image intensities is calculated as the standard deviation over the ROI of the aforesaid differenced intensity values divided by the square root of the number of intensity values in the neighbourhood of intensities over which the image filtering was performed.

A map or distribution of parameters generated by this method is used to identify and characterise both normal and abnormal tissue types. For example, over the liver the parameters may be used to determine the presence and extent of fibrosis, cirrhosis, lesions or tumours. The parameters may also be formulated so that the formulation-correlates with a measure of tissue iron overload for the region of interest, and thus enables the generation of an iron loading map or distribution for that region. For example, the transverse relaxation time constant parameter $T_2$ may simply be inverted to be formulated as the transverse relaxation rates $1/T_2$, which may then be correlated with the tissue iron measurement. When the liver is taken as the region of interest, the formulated parameters may be correlated with the hepatic iron concentration, and a map or distribution of the hepatic iron concentration obtained. Further, where the parameters calculated by the curve-fitting procedure are transverse relaxation rates, the distribution of transverse relaxation rates may be parameterised by as few as one or two Gaussian functions to further characterise the ROI.

Figure 5:
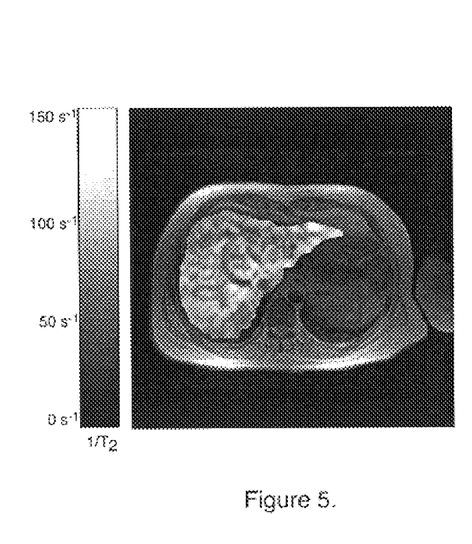
FIG. 5 illustrates a transverse relaxation rate map of a ROI through the liver produced by application of an embodiment of the present method.
Figure 6:
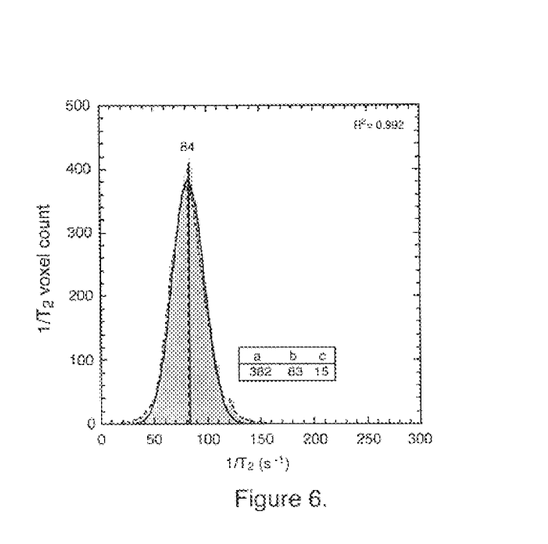
FIG. 6 illustrates the distribution of transverse relaxation rates corresponding to the map shown in FIG. 5.

An example transverse relaxation rate map generated by an embodiment of the present method is illustrated in FIG. 5 for a region of interest over the liver 22. The distribution of transverse relaxation rates corresponding to the map of FIG. 5 is illustrated in FIG. 6, and is characterised by a single Gaussian function. On FIG. 6, a=382 is the magnitude of the Gaussian, b=84 s$^{-1}$ is the mean of the Gaussian, and c=15 s$^{-1}$ is the standard deviation of the fitted Gaussian function.

Figure 7A:
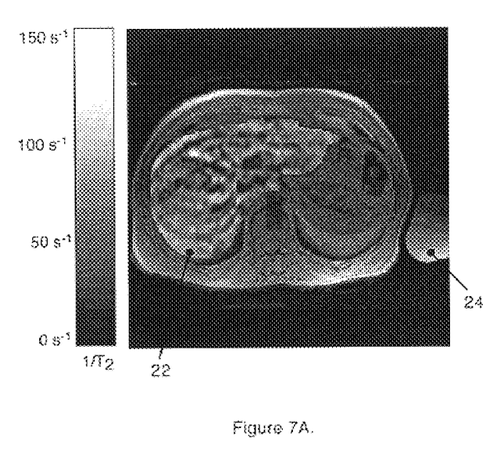
FIGS. 7A & 7B illustrate a transverse relaxation rate map and distribution respectively of a ROI through the liver for a first patient.
Figure 7B:
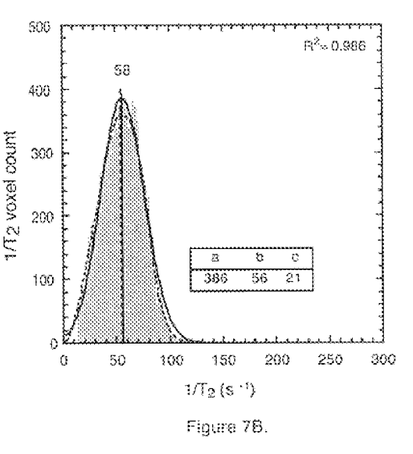
Figure 8A:
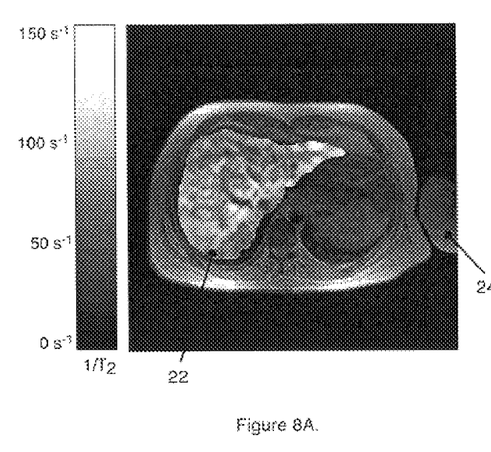
FIGS. 8A & 8B illustrate a transverse relaxation rate map and distribution respectively of a ROI through the liver for a second patient.
Figure 8B:
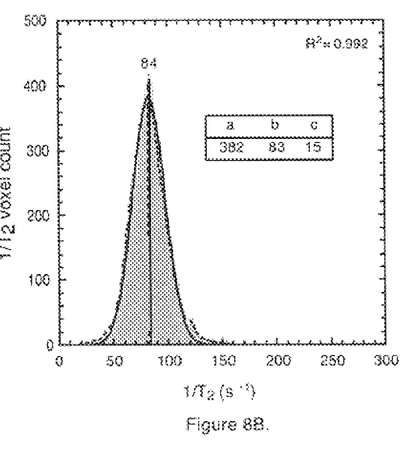
Figure 9A:
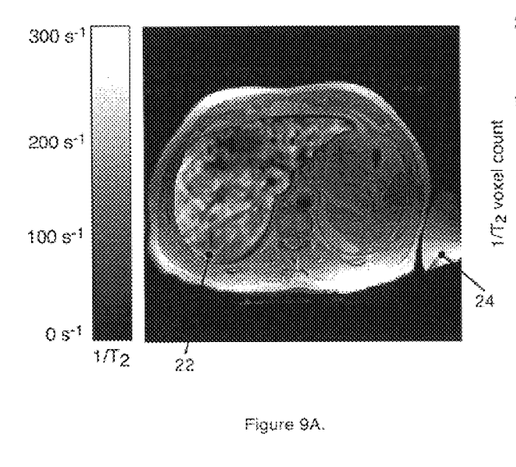
FIGS. 9A & 9B illustrate a transverse relaxation rate map and distribution respectively of a ROI through the liver for a third patient.
Figure 9B:
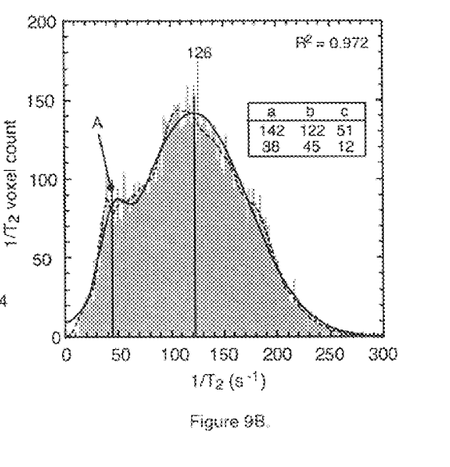
Figure 10A:
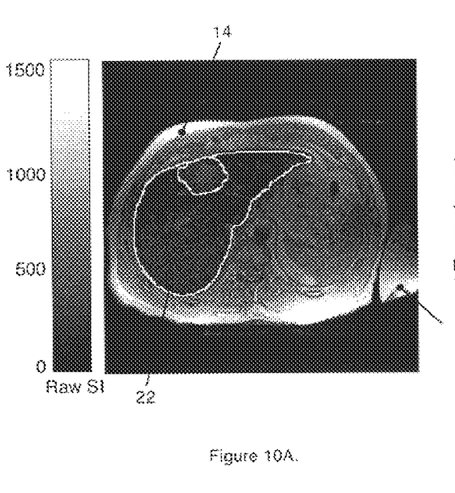
FIGS. 10A & 10B illustrate the ROI through the liver for the third patient depicted in FIG. 9A (on a TE=6 ms image), but further excluding the location of a tumour; and, an associated transverse relaxation rates distribution, respectively.
Figure 10B:
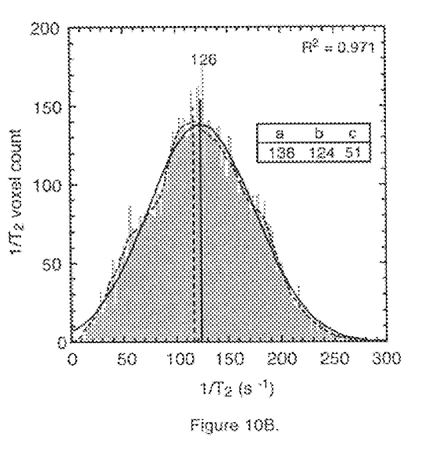

The usefulness of this method for the purposes of medical diagnosis is highlighted by reference to FIGS. 7A–10B. FIGS. 7A and 7B; 8A and 8B; and 9A and 9B depict transverse relaxation rate maps and distributions respectively for three different patients. The maps and distributions for each patient are clearly quite different. In the present embodiment, these variations can be interpreted as being correlated with differences in iron distribution throughout the liver of the three patients. In FIGS. 7B and 8B, the forms of the distributions (ie; the shapes of the curves) are quite similar, and a single Gaussian function can be fitted to the distributions in each case. However, the positions of the peak or mean values of the curves are translated relative to each other. This shift suggests a higher level of iron loading in the liver of the second patient than that in the first patient. In FIG. 9B, the distribution has a substantially greater width than the distributions in FIGS. 7B and 8B, and shows an irregularity A. This irregularity is due to the presence of a tumor and in FIG. 9B can be fitted by a second smaller Gaussian distribution in addition to the main Gaussian distribution. In FIG. 10A, the tumour has been excluded from the region 22 of interest in the liver of the third patient. By disregarding the area of the tumour, and regenerating the distribution in FIG. 10B, the irregularity A shown in FIG. 9B has been eliminated. Hence, the second Gaussian distribution which was fitted to the irregularity can be used to characterise the tumour. The difference between the positions of the two peaks of the Gaussian components in FIGS. 9B and 10B suggest that the iron concentration in the tumour is almost one third of the iron concentration in the surrounding liver tissue. This embodiment of the present method can thus be used to more substantially identify and characterise tumours in the liver than the unprocessed images alone.

From the above description, it will be apparent to those skilled in the relevant arts that the present method has numerous advantages and benefits over prior art methods for characterising the transverse relaxation processes over the abdomen. Specifically, the present method compensates for the breathing artefacts in the $T_2$-weighted images.

Additionally, in order to obtain both accurate and precise relaxation time constants, the method takes account of other significant factors. These include background signal level offset and noise level, instrumental drift, and the extent of the measurement error on the filtered image intensities. This allows for the derivation of relaxation time constants that are essentially independent of the magnetic resonance images on which the images are acquired.

Now that an embodiment of the invention has been described it will be apparent to those skilled in the relevant arts that numerous modifications and variations may be made without departing from the basic inventive concepts. For example, while FIG. 3 depicts the use of three spin-echo times in the curve fitting process, more times can be used, either for increased accuracy or to impart further knowledge on the relaxation processes being mapped. For example, with five or more images acquired at different spin-echo times, a bi-exponential curve may be fitted to the processed image intensities. In reference to equation (1) the bi-exponential form is for when N=2, providing the equation $$I(TE) = I_f(0)e^{-TE/T_{2f}} + I_s(0)e^{-TE/T_{2s}} + S_{LO}$$

where $I_f(0)$ is $I_1(0)$, $T_{2f}$ is $T_{21}$, $I_s(0)$ is $I_2(0)$, $T_{2s}$ is $T_{22}$. With this definitions, I(TE) is a processed image intensity at a given TE, $I_f(0)$ is the unknown intensity at TE=0 ms due to a fast relaxation component of hydrogen protons (and is to be determined by the curve-fitting procedure), $T_{2f}$ is the unknown transverse relaxation time constant that characterises the decay of the processed image intensities with increasing TE for the fast relaxation component of hydrogen protons (and is to be determined by the curve-fitting procedure), $I_s(0)$ is the unknown intensity at TE=0 ms due to a slow relaxation component of hydrogen protons (and is to be determined by the curve-fitting procedure), $T_{2s}$ is the unknown transverse relaxation time constant that characterises the decay of the processed image intensities with increasing TE for the slow relaxation component of hydrogen protons (and is to be determined by the curve-fitting procedure), and $S_{LO}$ is the signal level offset of the image signal intensities. Again, the curve fitting involves incorporation of the background signal level offset, instrumental drift, and the extent of the measurement errors on the filtered image intensities to obtain accurate and precise transverse relaxation time constants. The curve fitting also requires due consideration of the vicinity of the filtered image intensities to the background noise level.

Further, in the context of body iron overload, a variety of different formulations of the derived relaxation parameters may be correlated with the tissue iron measurements. For example, in the liver, the relaxation rates parameters determined by multi-exponential modelling may be weighted by their corresponding population densities and summed in various ways to enable improved correlation with the liver concentration. One such formulation which may enable improved correlation with the liver iron concentration is:

$$\frac{I_f(0) - S_{LO}}{(I_f(0) + I_s(0) - 2S_{LO})T_{2f}}$$

Also, other types of image filters may be used such as rank (and median) filters over a variety of window kernel shapes. Additionally, the signal level offset may be subtracted from the image intensities, either linearly or in quadrature and then appropriately omitted form the curve-fitting equation to determine the relaxation rates parameters. Finally, while the preferred embodiment is described in relation to the abdomen, it is envisaged that the method may be used for other parts of the body or for other devices, apparatuses, or structures that undergo localized movement.

All such modifications and variations that would be obvious to a person of ordinary skill in the art are deemed to be within the scope of the present invention the nature of which is to be determined from the above description and the appended claims.

What is claimed is:

1. A method of generating a map or distribution of values of parameters that are a function of proton transverse relaxation time constants $T_2$ in a target subject to localised movement using nuclear magnetic resonance imaging, the method comprising at least the steps of:

acquiring a sequence of three or more $T_2$-weighted magnetic resonance images of an identical image plane through the target at different spin-echo times (TE);

defining a region of interest (ROI) over the target within the $T_2$-weighted images that identifies the same region across all of the images;

processing image intensities of each $T_2$-weighted image within said ROI by application of an image filter that compensates for image intensity perturbations caused by localised movement of the target in said ROI to produce a filtered image intensity for each $T_2$-weighted image;

calculating parameters that are a function of $T_2$ by a curve-fitting procedure applied to the filtered image intensities as a function of the spin-echo time (TE); and, generating a map or distribution of values of said parameters calculated by said curve fitting procedure or of, other parameters that are a function of or correlate with the parameters calculated by said curve fitting procedure.

2. The method according to claim 1 wherein said step of acquiring the sequence of $T_2$-weighted images is performed at spin-echo times that are at least one order of magnitude less than a time period between repetitions of consecutive RF pulse sequences used in for generation of said $T_2$-weighted images.

3. The method according to claim 1 wherein said application of an image filter involves employing a procedure of spatial neighbourhood averaging to replace an image intensity within any $T_2$-weighted image at a given location within said ROI by an intensity that is a function of neighboring intensities in that image.

4. The method according to claim 3 wherein said neighboring intensities employed in the spatial neighbourhood averaging are bounded by a rectangular window kernel that covers a first range of movement of the target along a first axis of the image plane and a second range of movement of the target along a second perpendicular axis of the image plane.

5. The method according to claim 4 wherein, when said target is abdominal tissue, the first range of movement is between about 5 mm to 17 mm along said first axis perpendicular to a coronal plane and the second range of movement is about 4 mm to 14 mm along said second axis which lies either in a sagittal plane or an axial plane whereby, in use, the method accommodates for the breathing artefacts in the $T_2$-weighted images.

6. The method according to claim 1 wherein said curve fitting procedure includes incorporation of factors to compensate for one or more of background signal level offset; instrument drift; and measurement errors on the image intensities.

7. The method according to claim 1 wherein said curve fitting procedure includes fitting the following equation to the processed image intensities as a curve which models the decay of said intensities with increasing TE $$I(TE) = \sum_{n=1}^{N} (I_n(0)e^{-TE/T_{2n}}) + S_{LO}$$

where:
I(TE) is a processed image intensity at a given TE;
$S_{LO}$ is the signal level offset of the image signal intensities; and, when N=1, the said equation models signal exponential decay, and where substituting I(0) for $I_1(0)$ and $T_2$ for $T_{21}$:
  I(0) is the unknown intensity at TE=0 ms and is to be determined by the curve fitting procedure;
  $T_2$ is the unknown transverse relaxation time constant that characterises the decay of the processed image intensities with increasing TE and is to be determined by the curve fitting procedure;
or, when N=2, the said equation models bi-exponential decay, and where substituting $I_1(0)$ for $I_1(0)$, $T_{2f}$ for $T_{21}$, $I_s(0)$ for $I_2(0)$, and $T_{2s}$ for $T_{22}$:
  $I_f(0)$ is the unknown intensity at TE=0 ms due to a fast relaxation component of hydrogen protons and is to be determined by the curve fitting procedure;
  $T_{2f}$ is the unknown transverse relaxation time constant that characterises the decay of the processed image intensities with increasing TE for the fast relaxation component of hydrogen protons and is to be determined by the curve fitting procedure;
  $I_s(0)$ is the unknown intensity at TE=0 ms due to a slow relaxation component of hydrogen protons and is to be determined by the curve fitting procedure;
  $T_{2s}$ is the unknown transverse relaxation time constant that characterises the decay of the processed image intensities with increasing TE for the slow relaxation component of hydrogen protons and is to be determined by the curve fitting procedure.

8. The method according to claim 7 wherein said signal level offset is determined by analysis of background image intensities in a region free of image intensity perturbations caused by localised movement.

9. The method according to claim 8 wherein said background is a region within the $T_2$-weighted images that is predominantly free of the presence of hydrogen protons.

10. The method according to claim 7 wherein said signal level offset is taken as the mean intensity of a Poisson distribution fitted to the distribution of background image intensities.

11. The method according to claim 10 wherein said Poisson distribution fitted to the background image intensities is a generalised Poisson distribution of the form $$P(\chi) = \frac{\alpha\theta(\theta + \chi\lambda)^{(\chi-1)}e^{-(\theta+\chi\lambda)}}{\sqrt{2\pi\chi}\,(\chi/e)^\chi}, \quad \chi \geq 1$$

where:
is an image intensity value;
$\alpha$ is a scale factor, and;
$\theta$ and $\lambda$ parameterise the Poisson distribution,
and for which the mean $\mu$ of the Poisson distribution is $$\mu = \theta(1-\lambda)^{-1}$$

and the variance $\sigma^2$ is $$\sigma^2 = \theta(1-\lambda)^{-3},$$

12. The method according to claim 1 wherein said $T_2$-weighted images are acquired with fixed gain settings of equipment used to produce said nuclear magnetic resonance imaging.

13. The method according to claim 7 further including imaging of a phantom in-situ with the subject for the $T_2$-weighted magnetic resonance images for image intensity correction or image intensity error calculation purposes.

14. The method according to claim 13 wherein said $T_2$-weighted images are acquired over spin-echo times for which image intensities of the phantom are substantially constant, or for which a percentage change in the image intensities of the phantom over the spin-echo times is accurately known.

15. The method according to claim 14 wherein said phantom image intensities over the sequence of $T_2$-weighted images are analysed to determine ROI scale factors for each image relative to one of the images to correct for the possible instrumental drift that may perturb the image signal intensities in the ROI over the sequence of $T_2$-weighted images.

16. The method according to claim 15 wherein said ROI scale factors that correct for the instrumental drift are determined by:
  choosing one of the $T_2$-weighted images as a reference image and treating any remaining $T_2$-weighted images as scalable images;
  obtaining mean intensity values for a number of regions over the phantom which are substantially free of intensity gradients in three or more of the $T_2$-weighted images and for which the regions are the same in each image;
  assigning the mean intensity values for the reference image to reference intensity values;
  dividing the mean intensity value for every region over the phantom for each scalable image by the reference intensity value for a matching region in the reference image to obtain an instrumental drift scale factor for every region in each of the scalable images;
  calculating the mean instrumental drift scale factor from the instrumental drift scale factors from any number of regions over the phantom for each scalable image;
  using the standard deviation of the instrumental drift scale factors as an uncertainty factor on the mean instrumental drift scale factor, and;
  assigning the mean instrumental drift scale factor for a scalable image to the ROI scale factor for that image.

17. The method according to claim 16, further including the step of incorporating any percentage change of said phantom image intensities over the spin-echo times is incorporated into the ROI scale factor for each image for those $T_2$-weighted image sequences for which the phantom image intensities are not effectively constant.

18. The method according to claim 17 wherein said instrumental drift over said sequence of $T_2$-weighted images is corrected for by dividing the filtered image intensities of each image by an associated ROI scale factor for that image.

19. The method according to claim 16 wherein the regions over the phantom for which instrumental drift scale factors are calculated exhibit a substantially identical measure of RF field variations as that over ROI.

20. The method according to claim 7 wherein said intensity measurement error on the image intensities specified for the curve-fitting procedure is calculated as the standard error over the ROI of differenced intensity values which are the filtered image intensities subtracted from unprocessed image intensities.

21. The method according to claim 20 wherein said standard error used as the intensity measurement error on the filtered image intensities is calculated as the standard deviation over the ROI of said differenced intensity values divided by the square root of the number of intensity values in the neighbourhood of intensities over which the image filtering was performed.

22. The method according to claim 1 wherein said parameters calculated by said curve-fitting procedure for the ROI facilitate identification and characterisation of normal and abnormal tissue types.

23. The method according to claim 1 wherein said ROI is through the liver of an animal or person and said parameters calculated by the curve-fitting procedure are used to determine the presence and extent of one or more of: fibrosis, cirrhosis, lesions or tumors.

24. The method according to claim 22 wherein said parameters calculated by the curve-fitting procedure are formulated so that they further correlate with a measure of tissue iron overload for that region.

25. The method according to claim 24 wherein said formulation for when N=1 for the curve-fitting equation is:

$$\frac{1}{T_2}.$$

26. The method according to claim 24 wherein said formulation for when N=2 for the curve-fitting equation is:

$$\frac{I_f(0) - S_{LO}}{(I_f(0) + I_s(0) - 2S_{LO})T_{2f}}.$$

27. The method according to claim 24 wherein ROI is through the liver and said measure of tissue iron overload is a measure of hepatic iron concentration.

28. The method according to claim 1 wherein said parameters calculated by said curve-fitting procedure are transverse relaxation rates and for which the distribution of transverse relaxation rates is parameterised by as few as one or two Gaussian functions to further characterise the ROI.

* * * * *